(12) United States Patent
Nakamura et al.

(10) Patent No.: US 7,839,198 B2
(45) Date of Patent: Nov. 23, 2010

(54) SEMICONDUCTOR INTEGRATED DEVICE

(75) Inventors: Tetsuya Nakamura, Tokyo (JP);
Hideaki Ito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/399,152

(22) Filed: Mar. 6, 2009

(65) Prior Publication Data

US 2009/0224817 A1 Sep. 10, 2009

(30) Foreign Application Priority Data

Mar. 7, 2008 (JP) ............... 2008-058508

(51) Int. Cl.
*H03L 5/00* (2006.01)
(52) U.S. Cl. ............... 327/333; 326/63; 326/81
(58) Field of Classification Search ............. 326/62–63, 326/80–81; 327/306, 333
See application file for complete search history.

(56) References Cited

U.S. PATENT DOCUMENTS 6,249,169 B1 *  6/2001  Okada .................. 327/333
6,873,186 B2    3/2005  Gion
7,474,138 B2 *  1/2009  Tsuchi et al. ............ 327/333
2002/0175737 A1* 11/2002  Debaty .................. 327/333
2006/0220696 A1 10/2006  Katou

FOREIGN PATENT DOCUMENTS

| JP | 01-231418 | 9/1989 |
| JP | 02-174418 | 7/1990 |
| JP | 2002-076882 | 3/2002 |
| JP | 2007-201704 | 8/2007 |

OTHER PUBLICATIONS

Japanese Office Action for 2008-058508 mailed Jun. 25, 2010.

* cited by examiner

*Primary Examiner*—Dinh T. Le
(74) *Attorney, Agent, or Firm*—Turocy & Watson, LLP (57) ABSTRACT

According to an aspect of the present invention, there is provided a semiconductor integrated device including: a level-shifting circuit including: a first and a second input nodes; and a first and a second output nodes; a first current mirror circuit connected with the first output node; a second current mirror circuit connected with the second output node; a first switch circuit series-connected with an input-side of first current mirror circuit; a second switch circuit series-connected with an input-side of the second current mirror circuit; a fifth switching element parallel-connected with the input-side of the first current mirror circuit; and a sixths switching element parallel-connected with the input-side of the second current mirror circuit.

20 Claims, 8 Drawing Sheets

SEMICONDUCTOR INTEGRATED DEVICE

CROSS-REFERENCE TO RELATED APPLICATIONS

This application claims priority from Japanese Patent Application No. 2008-058508 filed on Mar. 7, 2008, the entire contents of which are incorporated herein by reference.

BACKGROUND OF THE INVENTION

1. Field of the Invention

An aspect of the present invention relates to a semiconductor integrated device.

2. Description of the Related Art

A conventional level-shifting circuit has first and second p-channel metal oxide semiconductor (PMOS) transistors, each of which is connected to the drain of an associated one of first and second n-channel metal oxide semiconductor (NMOS) transistors as a load and has a gate cross-connected to the drain of the other PMOS transistor. In the conventional level-shifting circuit, as a voltage difference between before and after the level-shifting increases, an output signal is not completely inverted even when an input signal is inverted, and an operation is unstable.

Accordingly, although it is necessary to enhance drive capability by increasing gate lengths of the first and second NMOS transistors, it results increasing of the consumption current and the circuit area.

A semiconductor integrated device addressing these problems is known, which has a level-shifting circuit that adequately operates even if the ratio of a voltage before level-shifting to a voltage after the level-shifting is increased (see, e.g., JP-2002-076882-A).

The semiconductor integrated device disclosed in JP-2002-076882-A is provided with a level-shifting circuit that has an input node to which an input signal having a first amplitude is input and an output node from which an output signal having a second amplitude differing from the first amplitude is output, and that level-shifts the input signal having the first amplitude to the output signal having the second amplitude. This semiconductor integrated device is provided also with a current mirror circuit which charges the output node, and with a switch circuit which operates the current mirror circuit from when the input signal is inverted to when the output signal is inverted and which stops the current mirror circuit when the inversion has been finished.

However, since it takes time to stop an operation of the current mirror circuit in the semiconductor integrated device disclosed in JP-2002-076882-A, when the frequency of an input signal is increased, an output signal is not completely inverted, and the level-shifting circuit does not adequately operate.

SUMMARY OF THE INVENTION

According to an aspect of the present invention, there is provided a semiconductor integrated device including: a level-shifting circuit including: a first input node to which a first input signal having a first amplitude is input; a second input node to which a second input signal obtained by inverting the first input signal is input; a first output node from which a first output signal having a second amplitude being larger than the first amplitude is output; and a second output node from which a second output signal obtained by inverting the first output signal is output; a first current mirror circuit including: a first input-side transistor; and a first output-side transistor connected with the first output node; a second current mirror circuit including: a second input-side transistor; and a second output-side transistor connected with the second output node; a first switch circuit including: a first switching element that is series-connected with the first input-side transistor and that is controlled based on the first input signal; and a second switching element that is series-connected with the first switching element and that is controlled based on the second output signal; a second switch circuit including: a third switching element that is series-connected with the second input-side transistor and that is controlled based on the second input signal; and a fourth switching element that is series-connected with the third switching element and that is controlled based on the first output signal; a fifth switching element that is parallel-connected with the first input-side transistor and that is controlled based on the second output signal; and a sixths switching element that is parallel-connected with the second input-side transistor and that is controlled based on the first output signal.

According to another aspect of the present invention, there is provided a semiconductor integrated device including: a level-shifting circuit that includes: a first input node; a second input node; a first output node; and a second output node, and that outputs an output signal from the first and the second output nodes by level-shifting an input signal input to the first and the second input nodes; a first current mirror circuit that charges the first output node; a second current mirror circuit that charges the second output node; a first switch circuit that starts and stops an charging operation of the first current mirror circuit; a second switch circuit that starts and stops an charging operation of the second current mirror circuit; a fifth switching element that expedites a stopping operation of the first switch circuit; and a sixths switching element that expedites a stopping operation of the second switch circuit.

DETAILED DESCRIPTION OF THE INVENTION

Hereinafter, embodiments according to the invention are described with reference to the accompanying drawings.

Embodiment 1

Figure 1:
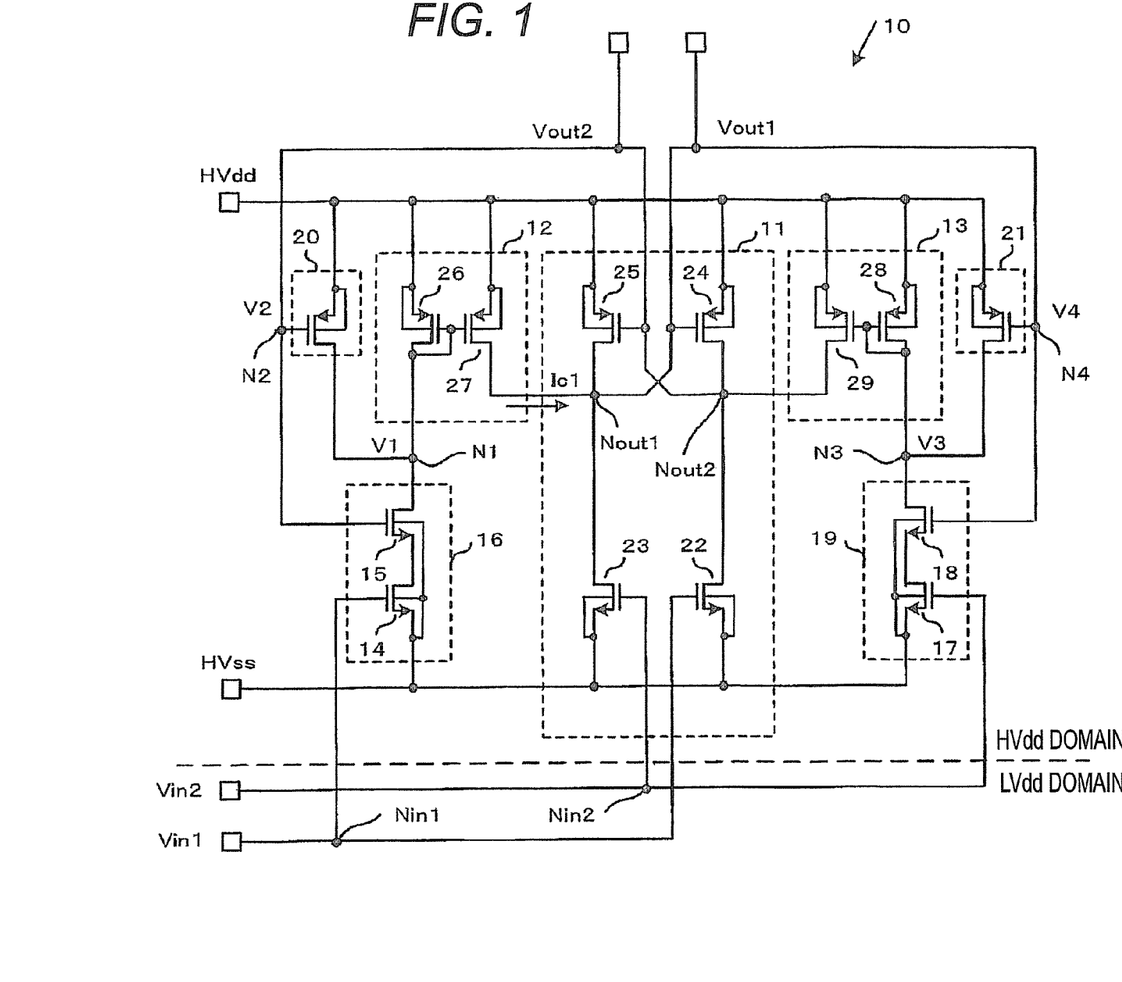
FIG. 1 is a circuit diagram of a semiconductor integrated device according to Embodiment 1 of the invention.
Figure 2:
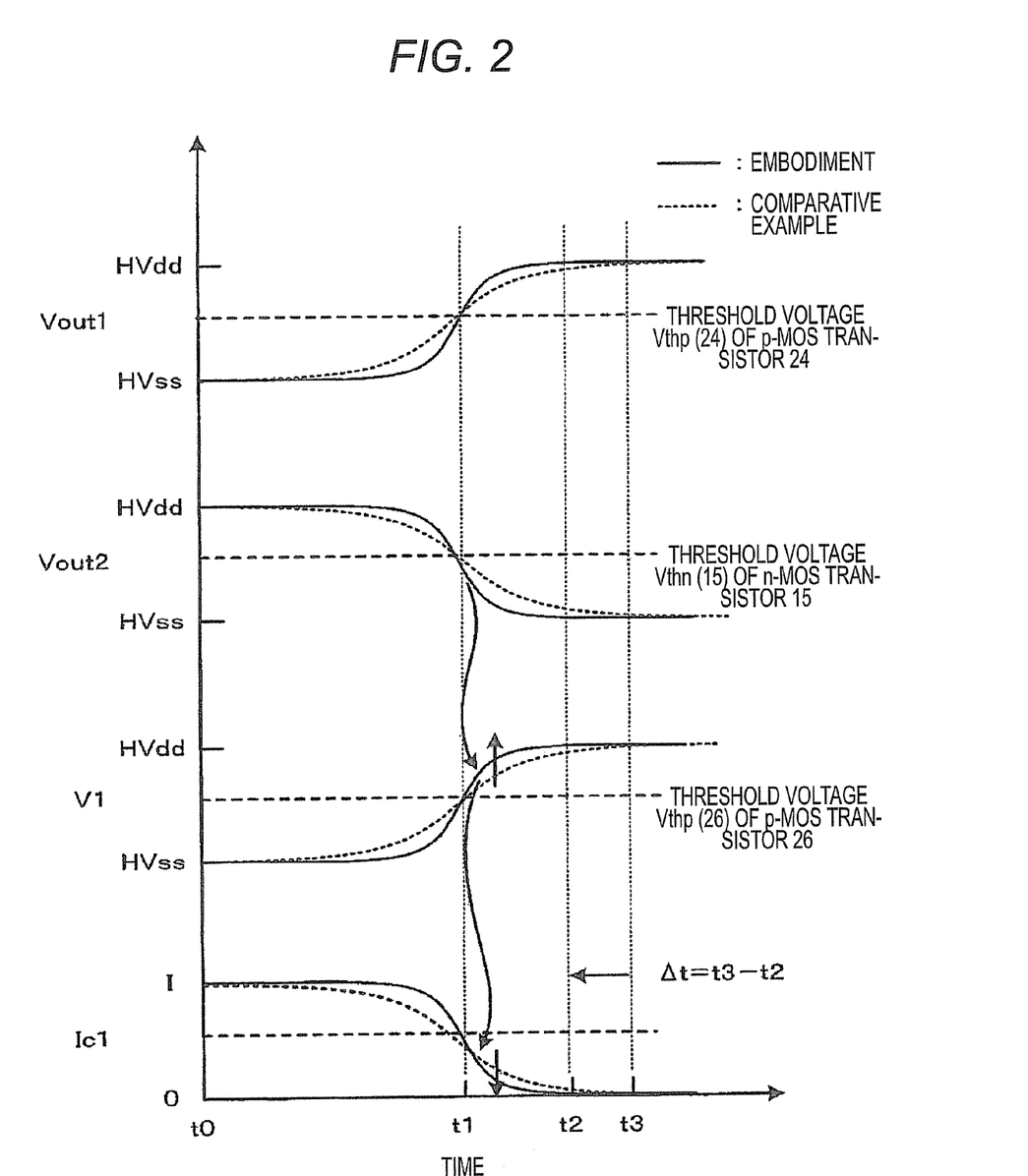
FIG. 2 is a timing chart illustrating an operation of the semiconductor integrated device according to Embodiment 1 by being contrasted with that of a comparative example.

A semiconductor integrated device according to Embodiment 1 of the invention is described below by referring to FIGS. 1 to 3E. FIG. 1 is a circuit diagram of a semiconductor integrated device according to Embodiment 1. FIG. 2 is a timing chart illustrating an operation of the semiconductor integrated device 1 by being contrasted with that of a comparative example. FIGS. 3A to 3E are timing charts each illustrating an operation of the semiconductor integrated device by being contrasted with that of the comparative example.

As illustrated in FIG. 1, a semiconductor integrated device 10 according to the present embodiment includes a level-shifting circuit 11 configured to have a first input node Nin1 to which a first input signal Vin1 having a first amplitude is input, a second input node Nin2 to which a second input signal Vin2 obtained by inverting the first input signal Vin1 is input, a first output node Nout1 from which a first output signal Vout1 having a second amplitude being larger than the first amplitude is output, and a second output node Nout2 from which a second output signal Vout2 obtained by inverting the first output signal Vout1 is output, and is configured to respectively level-shift first and second input signals Vin1 and Vin2 each having the first amplitude to first and second output signals Vout1 and Vout2 each having the second amplitude.

The semiconductor integrated device 10 further includes a first current mirror circuit 12 configured to charge the first output node Nout1, and a second current mirror circuit 13 configured to charge the second output node Nout2.

The semiconductor integrated device 10 further includes a first switch circuit 16 configured to have a series circuit of a first switching element 14 driven by the first input signal Vin1 and a second switching element 15 driven by the second output signal Vout2, and to operate the first current mirror 12, and a second switch circuit 19 configured to have a series circuit of a third switching element 17 driven by the second input signal Vin2 and a fourth switching element 18 driven by the first output signal Vout1, and to operate the second current mirror 13.

The semiconductor integrated device 10 further includes a fifth switching element 20 which is connected in parallel to an input side of the first current mirror circuit 12 and a sixth switching element 21 which is connected to an input side of the second current mirror circuit 13.

The fifth switching element 20 is driven by the second output signal Vout2 so as to prevent the unnecessary charging operation of the first current mirror circuit 12 to the first output node Nout1 after the first switch circuit 16 is turned off.

Similarly, the sixths switching element 21 is driven by the first output signal Vout1 so as to prevent the unnecessary charging operation of the second current mirror circuit 13 to the second output node Nout2 after the second switch circuit 19 is turned off.

The level-shifting circuit 11 includes enhancement-mode n-channel insulated gate field effect transistors (hereunder referred to as "NMOS transistors") 22 and 23, whose gates are respectively connected to the first and second input nodes Nin1 and Nin2 and whose sources are commonly connected to low voltage HVss, and enhancement-mode p-channel insulated gate field effect transistors (hereunder referred to as "PMOS transistors") 24 and 25, which are respectively connected to the drains of the NMOS transistors 22 and 23 as loads so that the gates and the drains of the PMOS transistors 24 and 25 are cross-connected to each other, and that the sources of the PMOS transistors 24 and 25 are commonly connected to high voltage HVdd. The drain of the NMOS transistor 23 is used as the first output node Nout1, while the drain of the NMOS transistor 22 is used as the second output node Nout2.

A first amplitude before the level-shifting is, e.g., (LVdd−LVss) level. A second amplitude after the level-shifting is, e.g., (HVdd−HVss) level.

The high voltage HVdd is, e.g., 3.3 volts (V). The low voltage HVss is, e.g., 0 V. Voltage LVdd is, e.g., the intermediate voltage between the high voltage and the low voltage, and is, e.g., 1.2 V. Voltage LVss (not shown) is equal to the low voltage HVss.

The first current mirror circuit 12 includes PMOS transistors 26 and 27. The PMOS transistor 26 is such that the source thereof is connected to the high voltage HVdd, that the drain thereof is connected to the first node N1, and that the gate and the drain thereof are connected to each other.

The PMOS transistor 27 is such that the source thereof is connected to the high voltage HVdd, that the gate is connected to the gate of the PMOS transistor 26, and that the drain thereof is connected to the first output node Nout1.

Similarly, the second current mirror circuit 13 includes PMOS transistors 28 and 29. The PMOS transistor 28 is such that the source thereof is connected to the high voltage HVdd, that the drain thereof is connected to the third node N3, and that the gate and the drain thereof are connected to each other.

The PMOS transistor 29 is such that the source thereof is connected to the high voltage HVdd, that the gate is connected to the gate of the PMOS transistor 28, and that the drain thereof is connected to the second output node Nout2.

The first and second switching elements 14 and 15 of the first switch circuit 16 are NMOS transistors. The source of the NMOS transistor 14 serving as the first switching element is connected to the low voltage HVss, while the gate thereof is connected to the first input node Nin1.

The drain of the NMOS transistor 15 serving as the second switching element is connected to the first node N1. The gate thereof is connected to the second node N2. The source thereof is connected to the drain of the NMOS transistor 14.

Similarly, the third and fourth switching elements 17 and 18 of the second switch circuit 19 are NMOS transistors. The source of the NMOS transistor 17 serving as the third switching element is connected to the low voltage HVss. The gate thereof is connected to the second input node Nin2.

The drain of the NMOS transistor 18 serving as the fourth switching element is connected to the third node N3. The gate thereof is connected to the fourth node N4. The source thereof is connected to the drain of the NMOS transistor 17.

The second node N2 is connected to the second output node Nout2. The fourth node N4 is connected to the first output node Nout1.

The fifth switching element 20 is a PMOS transistor. The PMOS transistor 20 serving as the fifth switching element is such that the source thereof is connected to the high voltage HVdd, that the drain thereof is connected to the first node N1, and that the gate thereof is connected to the second node N2.

Similarly, the sixth switching element 21 is a PMOS transistor. The PMOS transistor 21 serving as the sixth switching element is such that the source thereof is connected to the high voltage HVdd, that the drain thereof is connected to the third node N3, and that the gate thereof is connected to the fourth node N4.

First, a basic operation of the level-shifting circuit 11 of the semiconductor integrated circuit device 10 is described below. It is assumed, as an initial state, that the voltage of the first input signal Vin1 is "L" level (approximately equal to LVss), and that the voltage level of the second input signal Vin2 is "H" level (approximately equal to LVdd).

In this state, in the level-shifting circuit 11, the NMOS transistor 22 is off, and the NMOS transistor 23 is on. Consequently, the voltage level of the first output node Nout1 is "L" level (approximately equal to HVss), and that the voltage level of the second output node Nout2 is "H" level (approximately equal to HVdd).

From this state, the voltage level of the first input signal Vin1 is inverted from "L" level to "H" level, and that of the second input signal Vin2 is inverted from "H" level to "L" level.

Then, the NMOS transistor 14 of the first switch circuit 16 is turned on. In an initial stage of this inversion operation, the voltage level of the second output signal Vout2 (hereunder referred to also simply as voltage Vout2) output from the second output node Nout2 maintains approximately "H" level. Thus, the NMOS transistor 15 of the first switch circuit 16 remains turned on.

Due to the turning-on of both the NMOS transistors 14 and 15, in the first current mirror circuit 12, the PMOS transistor 26 provided at the input side and the PMOS transistor 27 provided at the output side thereof are turned on. Thus, the first current mirror circuit 12 starts operating.

At that time, since the NMOS transistor 23 has already been turned off by the "L"-level second input signal Vin2, the first output node Nout1 is charged by the first current mirror circuit 12. When the first output node Nout1 is sufficiently charged, the PMOS transistor 24 of the level-shifting circuit 11 is turned off.

At that time, the NMOS transistor 22 has already been turned on by the "L"-level first input signal Vin1. Thus, the second output node Nout2 is discharged through the turned-on NMOS transistor 22. Consequently, the voltage level Vout2 of the second output node Nout2 is lowered towards "L" level.

In response to this, the PMOS transistor 25 of the level-shifting circuit 11 is turned on and charges the first output node Nout1. Consequently, the voltage level of the first output signal Vout1 (hereunder referred to also simply as the voltage Vout1) output from the first output node Nout1 rises towards "H" level.

When the voltage level Vout2 of the second output node Nout2 becomes equal to or lower than the threshold voltage of the NMOS transistor 15 of the first switch circuit 16, the NMOS transistor 15 is turned off. Thus, the PMOS transistors 26 and 27 are turned off, and an operation of the first current mirror circuit 12 is stopped.

FIG. 2 is a timing chart illustrating an operation of the semiconductor integrated device 10 by being contrasted with that of a comparative example. Solid curves correspond to the present embodiment, and dotted curves correspond to the comparative example.

The comparative example is a device obtained by removing the PMOS transistors 20 and 21 from the semiconductor integrated device 10 shown in FIG. 1. An operation of the comparative example is described below.

As indicated by the dotted curves shown in FIG. 2, the voltage Vout1 of the first output node Nout1 gradually rises in the comparative example due to the turn-off of the NMOS transistor 23.

The voltage Vout2 of the second output node Nout2 gradually lowers due to the turn-on of the NMOS transistor 22.

In response to the rise of the voltage Vout1 of the first output node Nout1, an output current Ic1 flowing through the output-side PMOS transistor of the first current mirror circuit 12 gradually lowers, while the voltage V1 of the first node N1 gradually rises.

At time t1, the voltage Vout1 becomes higher than the threshold voltage of the PMOS transistor 24, so that the PMOS transistor 24 is turned off.

Simultaneously, the voltage Vout2 becomes smaller than the threshold voltage of the NMOS transistor 15, so that the NMOS transistor 15 is turned off.

When the NMOS transistor 15 is turned off, the first node N1 is charged by the input-side PMOS transistor 26 of the first current mirror circuit 12. When the first node N1 has been charged, the input-side PMOS transistor 26 is turned off, and the first current mirror circuit 12 is turned off. However, it takes time to charge the first node N1, and during the charging, the output current Ic1 continues to flow until time t3 beyond time t1.

Consequently, the voltage Vout1 continues to rise until time t3. The voltage Vout2 continues to lower until time t3.

On the other hand, as indicated by solid curves shown in FIG. 2, similarly, in the present embodiment, the voltage Vout1 of the first output node Nout1 gradually rises through the turned-off NMOS transistor 23. Further, the voltage Vout2 of the second output node Nout2 gradually lowers through the turned-on NMOS transistor 22.

At time t1, while the NMOS transistor 15 is turned off, the PMOS transistor 20 turns on to thereby rapidly raise the voltage V1 of the first node N1 to the high voltage HVdd through the turned-on PMOS transistor 20. In the first current mirror circuit 12, since the input-side PMOS transistor 26 rapidly turns off, the output-side PMOS transistor 27 also rapidly turns off, and the output current Ic1 rapidly lowers. Accordingly, the level of the output current Ic1 is reduced to 0 in a time (t2−t0) which is shorter than a time (t3−t0).

Thus, the stoppage of the unnecessary charging of the first output node Nout1 can be expedited by a time Δt=t3−t2.

Time t2 is a stop time point at which the charging of the first output node N1 is stopped, in the present embodiment. Time t3 is a stop time point at which the charging of the first output node N1 is stopped, in the comparative example.

On the other hand, in the time-period of the aforementioned operation, the PMOS transistor 21 and the NMOS transistor 17 of the second switch circuit 19 are off. Thus, the voltage V3 of the third node N3 does not exceed the threshold voltage of the output-side PMOS transistor 29 of the second current mirror circuit 13. The voltage V3 is always off. Therefore, the voltage V3 does not affect an operation of the level-shifting circuit 11.

FIGS. 3A to 3E are timing charts each illustrating an operation of the semiconductor integrated device 10, which is obtained by simulation, by being contrasted with that of the comparative example. Solid curves correspond to the present embodiment, and dotted curves correspond to the comparative example.

Figure 3A:
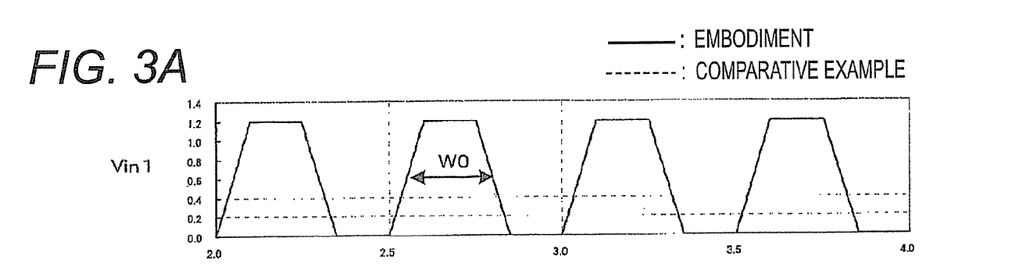
FIGS. 3A to 3E are timing charts each illustrating an operation of the semiconductor integrated device according to Embodiment 1 by being contrasted with that of the comparative example.
Figure 3B:
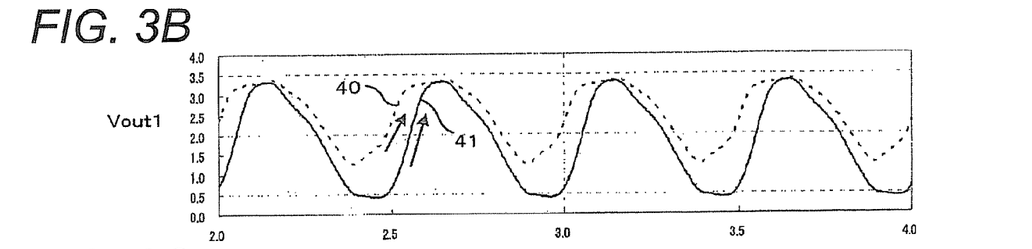
Figure 3C:
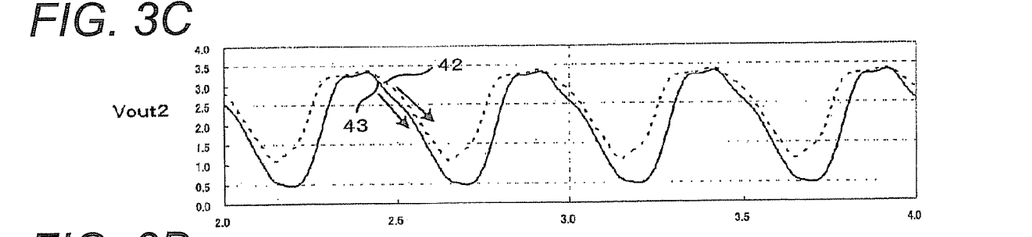
Figure 3D:
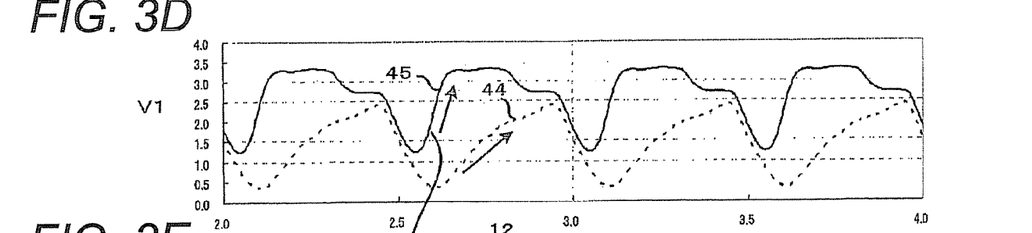
Figure 3E:
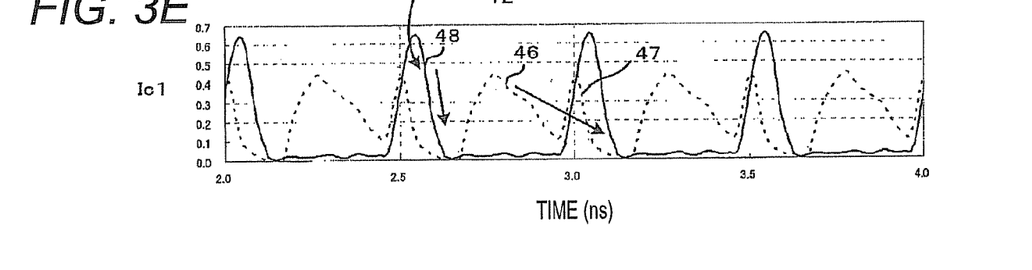

FIG. 3A shows the first input signal Vin1. FIG. 3B shows the voltage Vout1 of the first output node Nout1. FIG. 3C shows the voltage Vout2 of the second output node Nout2. FIG. 3D shows the voltage V1 of the first node N1. FIG. 3E shows the output current Ic1 of the first current mirror circuit 12. Each of the timing charts illustrates a simulation result of a steady-state operation from 2 nanoseconds (ns) to 4 ns after the operation starts.

As illustrated in FIG. 3A, the first input signal Vin1 is a rectangular wave which has a repetition frequency of 2 gigahertz (GHz) (a cycle is 0.5 ns), a rise/fall time of 0.1 ns, a first amplitude (LVdd–LVss) of 1.2 V, and a duty ratio of 0.5 (a half value width is W0).

As illustrated in FIG. 3B, in the comparative example, the voltage Vout1 of the first output node Nout1 rises as indicated by a dashed curve 40.

On the other hand, in the present embodiment, the voltage Vout1 of the first output node Nout1 rises, as a solid curve 41. It turns out that the rise-time steepness of the solid curve 41 is larger than that of a dashed curve 40.

As illustrated in FIG. 3C, in the comparative example, the voltage Vout2 of the second output node Nout2 lowers, as indicated by the dashed curve 42.

On the other hand, in the present embodiment, the voltage Vout2 of the second output node Nout2 lowers, as indicated by a solid curve 43. It turns out that the fall-time steepness of the solid curve 43 is slightly larger than that of the dashed curve 42.

As illustrated in FIG. 3D, in the comparative example, the voltage V1 of the first node N1 rises, as indicated by a dashed curve 44.

On the other hand, in the present embodiment, the voltage V1 of the first node N1 rises, as indicated by a solid curve 45. It turns out that the rise-time steepness of the solid curve 45 rapidly increases, as compared with that of the dashed curve 44.

As illustrated in FIG. 3E, in the comparative example, even when the voltage Vout1 of the first output node Nout1 should be lowered, a sub-peak current indicated by a dashed curve 46 flows as the output current Ic1 of the first current mirror circuit 12.

Consequently, the first output node Nout1 is charged, the voltage Vout1 of the first output node Nout1 does not sufficiently lower, and the second amplitude is reduced.

On the other hand, in the present embodiment, the output current Ic1 of the first current mirror circuit 12 indicated by the solid curve 43 is larger in peak than a dashed curve 47. And, a sub-peak current that disturbs the lowering of the voltage Vout1 of the first output node Nout1 does not flow.

That is, the simulation results illustrated in FIGS. 3A to 3E support the operation of the semiconductor integrated device 10 as schematically illustrated in FIG. 2.

As the repetition frequency of the first input signal Vin1 increases, the difference between the present embodiment and the comparative example increases.

Figure 4A:
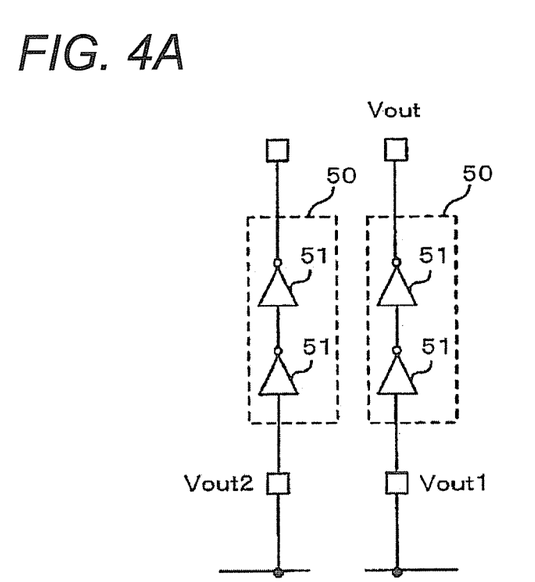
FIG. 4A is a circuit diagram illustrating a waveform shaping circuit.
Figure 4B:
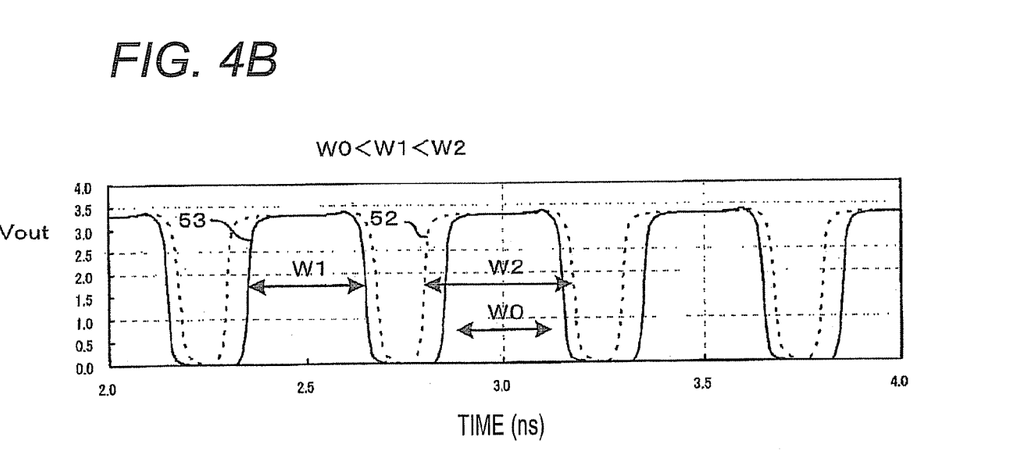
FIG. 4B is a chart illustrating a waveform-shaped output of the semiconductor integrated device according to Embodiment 1 by being contrasted with that of the comparative example.

FIGS. 4A and 4B illustrate the first output signal Vout1 of the first output node Nout1, which is waveform-shaped to be supplied to an external device, by being contrasted with an output signal of the comparative example. FIG. 4A illustrates a waveform shaping circuit, and FIG. 4B illustrates a chart of the waveform-shaped first output signal Vout1. A solid curve corresponds to the present embodiment, and a dotted curve corresponds to the comparative example.

As illustrated in FIG. 4A, the waveform shaping circuit 50 includes a series circuit of two inverters 51 to make an input thereto and an output therefrom to be in phase with each other. The threshold voltage of each inverter 51 is less than the second amplitude (HVdd–HVss). Usually, the threshold voltage of each inverter 51 is set at half the second amplitude, i.e., at (HVdd–HVss)/2.

As illustrated in FIG. 4B, in the comparative example, a rectangular wave having a half-value width W2 indicated by the dotted curve 52 is obtained by passing the first output signal Vout1 of the first output node Nout1 through the waveform shaping circuit 50. The half-value width W2 is larger than the half-value width W0 of the original first input signal Vin1.

Thus, there is obtained an output signal Vout having the cycle period equal to that of the first input signal Vin1 and the duty ratio larger than that of the first input signal Vin1.

On the other hand, in the present embodiment, a rectangular wave having a half-value width W1 indicated by the solid curve 53 is obtained. The half-value width W1 is larger than that W0 of the first input signal Vin1 and is smaller than that W2.

Accordingly, there is obtained an output signal Vout having the cycle period equal to the first input signal Vin1 and the duty ratio closer to that of the first input signal Vin1.

It has been described the case where the voltage of the first input signal Vin1 is inverted from "L" level to "H" level.

When the voltage of the first input signal Vin1 is inverted from "H" level to "L" level, the second switch circuit 19 having the NMOS transistors 17 and 18 is turned on. Then, the second mirror circuit 13 having the PMOS transistors 28 and 29 is operated, so that the second output node Nout2 is charged to the high voltage HVdd.

Then, when the voltage Vout1 of the first output node Nout1 becomes equal to or lower than the threshold voltage of the NMOS transistor 18 of the second switch circuit 19, the NMOS transistor 18 is turned off. Thus, the operation of the second current mirror circuit 13 is stopped.

In an initial stage of such an inversion operation, the first output node Nout1 is charged by the first current mirror circuit 12. Alternatively, the second output node Nout2 is charged by the second current mirror circuit 13. Thus, the PMOS transistor 24 or 25 of the level-shifting circuit 11 is turned off.

Consequently, even if the ratio (HVdd–HVss)/(LVdd–LVss) of the voltage after level-shifting (HVdd–HVss) to the voltage before the level-shifting (LVdd–LVss) is increased, the level-shifting circuit can be operated at sufficiently high speed.

As described above, the semiconductor integrated device 10 according to the present embodiment includes the PMOS transistor 20 that is connected to the input side of the first current mirror circuit 12 and is driven by the second output signal Vout2.

Similarly, the semiconductor integrated device 10 according to the present embodiment includes the PMOS transistor 21 that is connected to the input side of the second current mirror circuit 13 and is driven by the first output signal Vout1.

Consequently, the PMOS transistor 20 is turned on when the first switch circuit 16 has been turned off, and the voltage V1 of the first node N1 is rapidly raised. Thus, an unnecessary charging operation of the first current mirror circuit 12 to the first output node Nout1 can be more swiftly stopped as compared with a case where the PMOS transistor 20 is not provided.

Consequently, the PMOS transistor 21 is turned on when the second switch circuit 19 has been turned off, and the voltage V3 of the third node N3 is rapidly raised. Thus, an unnecessary charging operation of the second current mirror circuit 13 to the second output node Nout2 can be swiftly stopped as compared with a case where the PMOS transistor 21 is not provided.

Thus, the semiconductor integrated device 10 having the level-shifting circuit 11 which operates at high speed can be obtained.

In the present embodiment, each element is adjusted so that the PMOS transistor 20 is turned on when the first switch 16 turns off. Alternatively, each element may be adjusted so that the NMOS transistor 15 of the first switch circuit 16 is turned off after the PMOS transistor 20 turns on and the voltage V1 of the first node N1 is raised at a stretch. To change the operation timing of each element, for example, the threshold voltages of transistors may be adjusted.

However, if a time period in which the PMOS transistor 20 and the NMOS transistor 15 are simultaneously turned on is long, the transistors 15 and 20 operate to simultaneously raise and lower the voltage of the first node N1. Thus, it is necessary to take care whether an unbalanced condition occurs and whether a throughout current continues to flow.

Embodiment 2

Figure 5:
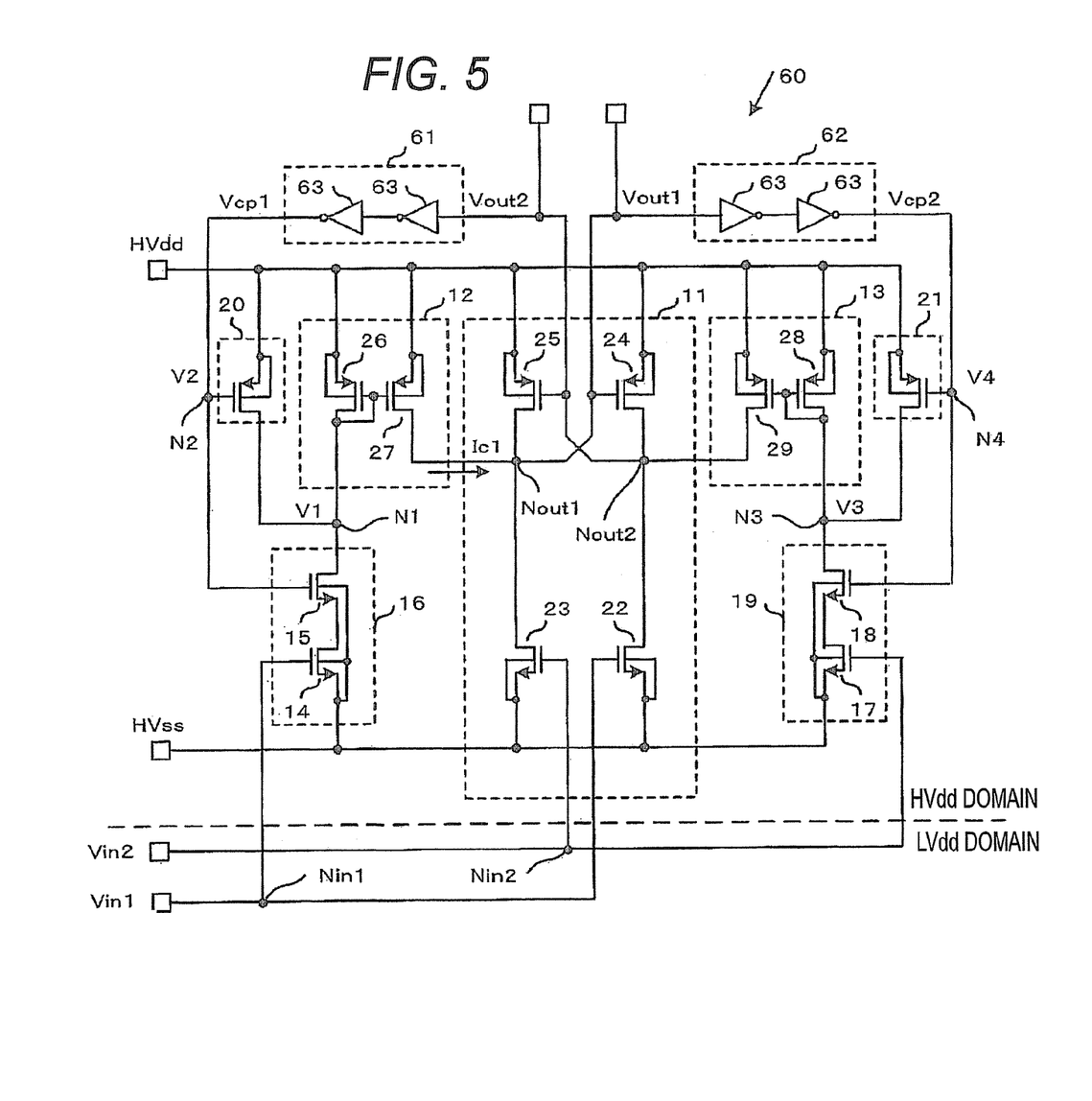
FIG. 5 is a circuit diagram of a semiconductor integrated device according to Embodiment 2 of the invention, which includes a control circuit.
Figure 6:
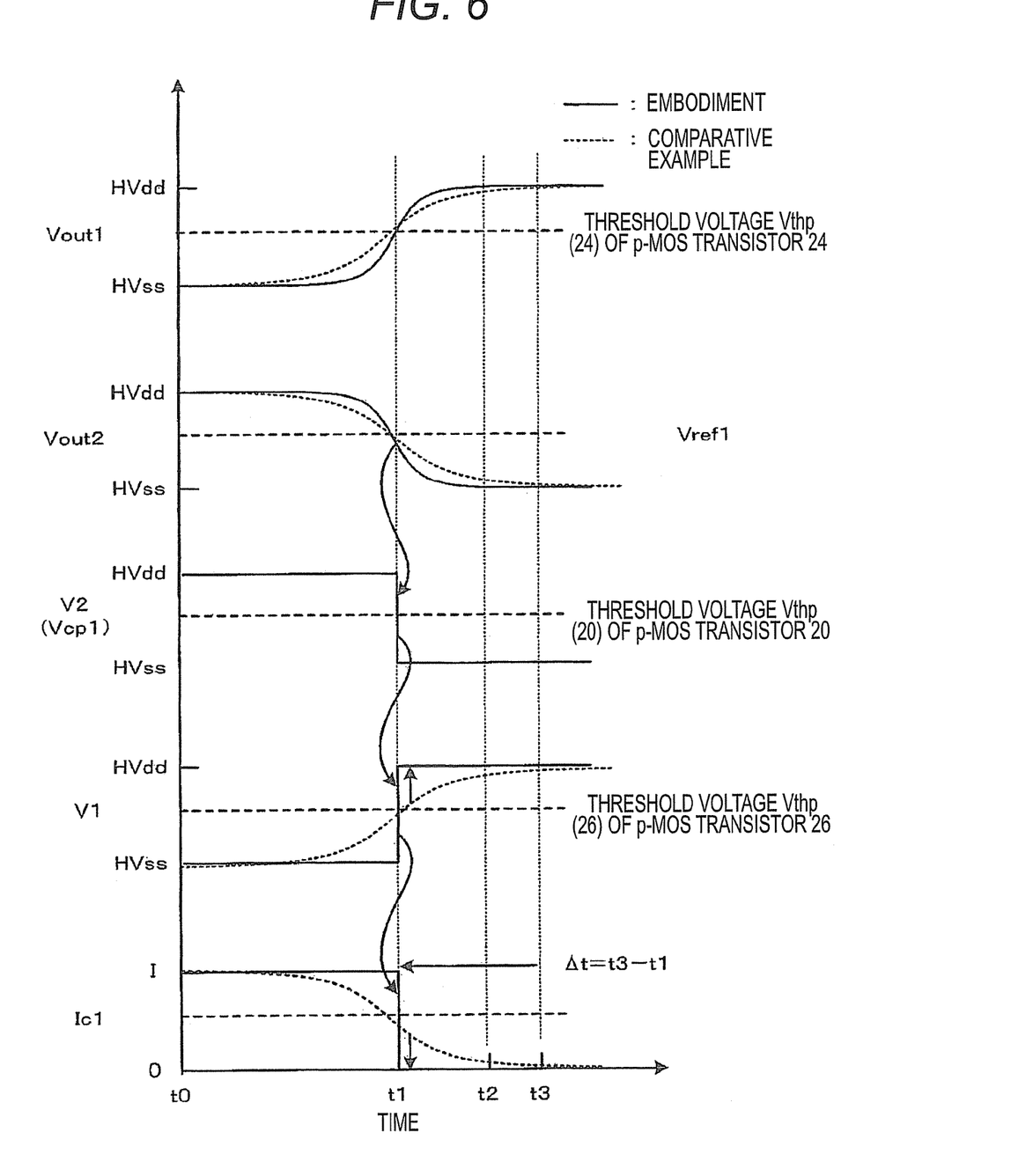
FIG. 6 is a timing chart illustrating an operation of the semiconductor integrated device according to Embodiment 2 by being contrasted with that of a comparative example.

A semiconductor integrated device according to Embodiment 2 of the invention is described below with reference to FIGS. 5 to 7E. FIG. 5 is a circuit diagram of the semiconductor integrated device according to Embodiment 2. FIG. 6 is a timing chart illustrating an operation of the semiconductor integrated device by being contrasted with that of the comparative example. FIGS. 7A to 7E are timing charts each illustrating an operation of the semiconductor integrated device by being contrasted with that of the comparative example.

Components of the present embodiment, which are the same as those of the aforementioned Embodiment 1, are designated with the same reference numerals. Thus, the description of such components is omitted. In the following description of Embodiment 2, only components differing from those of Embodiment 1 are described below.

Embodiment 2 differs from Embodiment 1 in that inverters are connected between a second output node and a second node and between a first output node and a fourth node.

That is, as illustrated in FIG. 5, a semiconductor integrated device 60 according to Embodiment 2 includes a first control circuit 61 which is connected between a second output node Nout2 and a second node N2 and compares a second output signal Vout2 with a first reference value Vref1 to output a first comparison signal Vcp1 and to drive an NMOS transistor (corresponding to the second switching element) 15 and a PMOS transistor (corresponding to the fifth switching element) 20 according to the first comparison signal Vcp1.

Further, the semiconductor integrated device 60 of the present embodiment includes a second control circuit 62 which is connected between a first output node Nout1 and a fourth node N4 and compares a first output signal Vout1 with a second reference value Vref2 to output a second comparison signal Vcp2 and to drive an NMOS transistor (corresponding to the fourth switching element) 18 and a PMOS transistor (corresponding to the sixth switching element) 21 according to the second comparison signal Vcp2.

The first control circuit 61 includes a series circuit of an even number of (two in this case) complementary metal oxide semiconductor (CMOS) inverters 63. The threshold voltage of each CMOS inverter 63 for inverting an output thereof is adjusted nearly equal to a half of a power supply voltage. Thus, the first reference value Vref1 is approximately (HVdd−HVss)/2.

Similarly, the second control circuit 62 includes a series circuit of two CMOS inverters 63. The second reference value Vref2 is adjusted to be equal to the first reference value Vref1 that is approximately (HVdd−HVss)/2.

A reason for setting the number of the series-connected inverters 63 at an even number is that an input to and an output of the first control circuit 61 are made to be in phase, and that an input to and an output of the second control circuit 62 are made to be in phase.

FIG. 6 is a timing chart illustrating an operation of the semiconductor integrated device 60 by being contrasted with that of the comparative example. Solid curves correspond to the present embodiment, and dotted curves correspond to the comparative example. The comparative example is the device obtained by removing the PMOS transistors 20 and 21 from the semiconductor integrated device 10 shown in FIG. 1 as described above, and the description thereof is omitted.

As illustrated in FIG. 6, in the present embodiment, similarly to the comparative example, due to the turn-off of an NMOS transistor 23, the voltage Vout1 of the first output node Nout1 gradually rises. In addition, due to the turn-on of an NMOS transistor 22, the voltage Vout of the second output node Nout2 gradually lowers.

At time t1, the voltage of the second output signal Vout2 lowers to the first reference value Vref1 of each inverter 63 of the first control circuit 61. Then, the inverters 63 operate, so that the voltage of the first comparison signal Vcp1 is inverted from "H" level to "L" level. Consequently, the voltage V2 of the second node N2 is changed from "H" level to "L" level.

Accordingly, the PMOS transistor 20 is turned on, while the NMOS transistor 15 is turned off. Thus, the voltage V1 of the first node N1 is raised to the high voltage HVdd like a step.

Consequently, the output current Ic1 of the first current mirror circuit 12 lowers like a step. Accordingly, the level of the output current Ic1 is reduced to 0 in a time (t1−t0) which is shorter than a time (t3−t0). Thus, the stoppage of charging of the first output node Nout1 can be expedited by a time Δt=t3−t1.

FIGS. 7A to 7E are timing charts each illustrating an operation of the semiconductor integrated device 10, which is obtained by simulation, by being contrasted with that of the comparative example. Solid curves correspond to the present embodiment, and dotted curves correspond to the comparative example. Since, the comparative example is the same as described above, the description thereof is omitted.

Figure 7A:
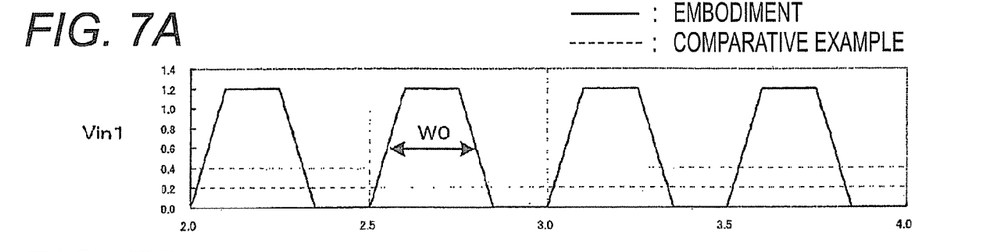
FIGS. 7A to 7E are timing charts each illustrating an operation of the semiconductor integrated device according to Embodiment 2 by being contrasted with that of the comparative example.
Figure 7B:
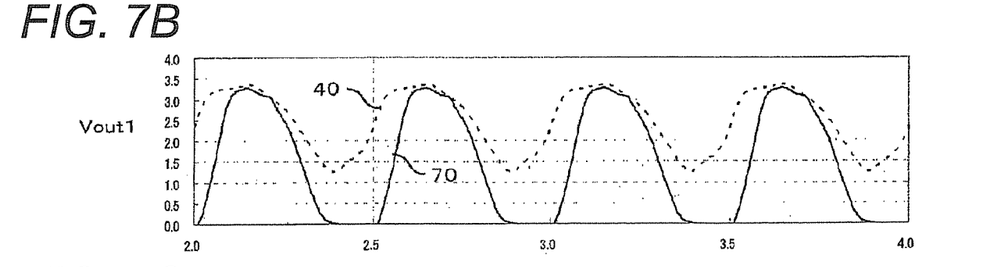
Figure 7C:
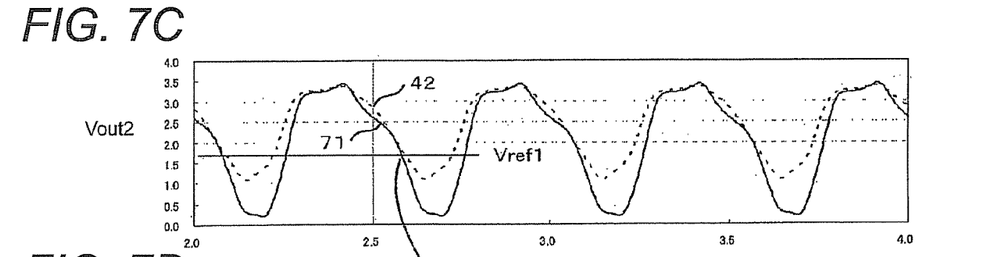
Figure 7D:
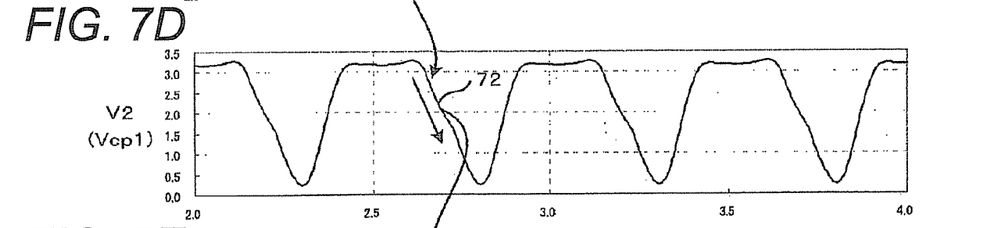
Figure 7E:
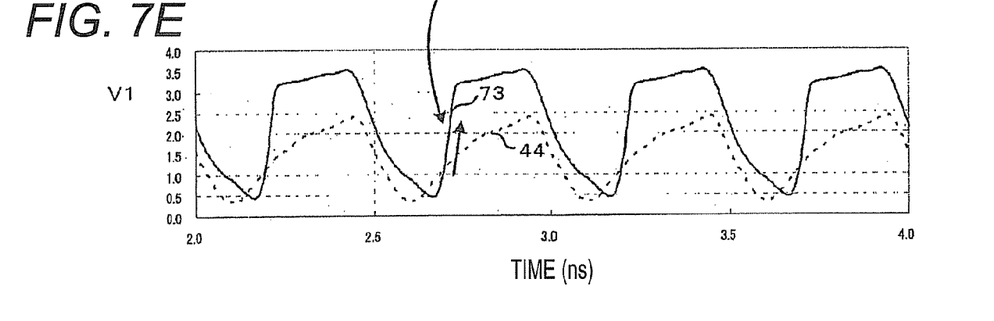

FIG. 7A shows the first input signal Vin1. FIG. 7B shows the voltage Vout1 of the first output node Nout1. FIG. 7C shows the voltage Vout2 of the second output node Nout2. FIG. 7D shows the voltage V2 of the second node N2. FIG. 7E shows the voltage V1 of the first node N1. Each of the timing charts illustrates a simulation result of a steady-state operation from 2 ns to 4 ns after the operation starts.

As illustrated in FIG. 7B, in the present embodiment, the voltage Vout1 of the first output node Nout1 rises as indicated by a solid curve 70.

As illustrated in FIG. 7C, in the present embodiment, the voltage Vout2 of the second output node Nout2 lowers as indicated by a solid curve 71.

As illustrated in FIG. 7D, in the present embodiment, when the level of the second output signal Vout2 is lowered to the first reference value Vref1, the inverters 63 operate. The level of the first comparison signal Vcp1 is inverted from "H" level to "L" level. Thus, the voltage V2 of the second node N2 is rapidly lowered, as indicated by a solid curve 72.

As illustrated in FIG. 7E, in the present embodiment, the voltage V1 of the first node N1 is rapidly raised, as indicated by a solid curve 73. Thus, it turns out that an output current Ic1 (not shown) of the first current mirror circuit 12 is rapidly lowered, as compared with the comparative example.

Consequently, the simulation results illustrated in FIGS. 7A to 7E support the operation of the semiconductor integrated device 60 as schematically illustrated in FIG. 6.

Further, even if the second output signal Vout2 is fluctuated due to noise or the like during the inverting time, since the "L"-level first comparison signal Vcp1 is output after the voltage Vout2 once reaches the first reference value Vref1, the charging of the first node N1 by the first current mirror circuit 12 is surely stopped. Thus, the semiconductor integrated device 60 according to the present embodiment is suited to a case where the waveform shaping circuit 50 is connected to the first and second output nodes Nout1 and Nout2 illustrated in FIG. 4A.

For the reliable operation, the threshold voltage of each inverter 63 of the first and second control circuits 61 and 62 is adjusted to be equal to or higher than the threshold voltage of each element that is to be connected to the first output node Nout1 and the second output node Nout2. For example, if the waveform shaping circuits 50 are connected thereto, the threshold voltage of each inverter 63 is adjusted to be equal to or higher than the threshold voltage of each inverter 51 of the waveform shaping circuit 50.

As described above, the semiconductor integrated device 60 according to the present embodiment includes the first control circuit 61 connected between the second output node and the second node and the second control circuit 62 connected between the first output node and the fourth node.

Consequently, the stoppage of charging the first output node Nout1 can be expedited, and that even if the amplitude of the second output signal Vout2 is fluctuated, the stoppage of charging is reliably be performed.

In the foregoing description, it has been described that each of the first and second control circuits 61 and 62 is a series circuit of two inverters 63. However, any even number can be employed as the number of series-connected inverters 63 such that an input signal and an output signal are made to be in phase.

Figure 8:
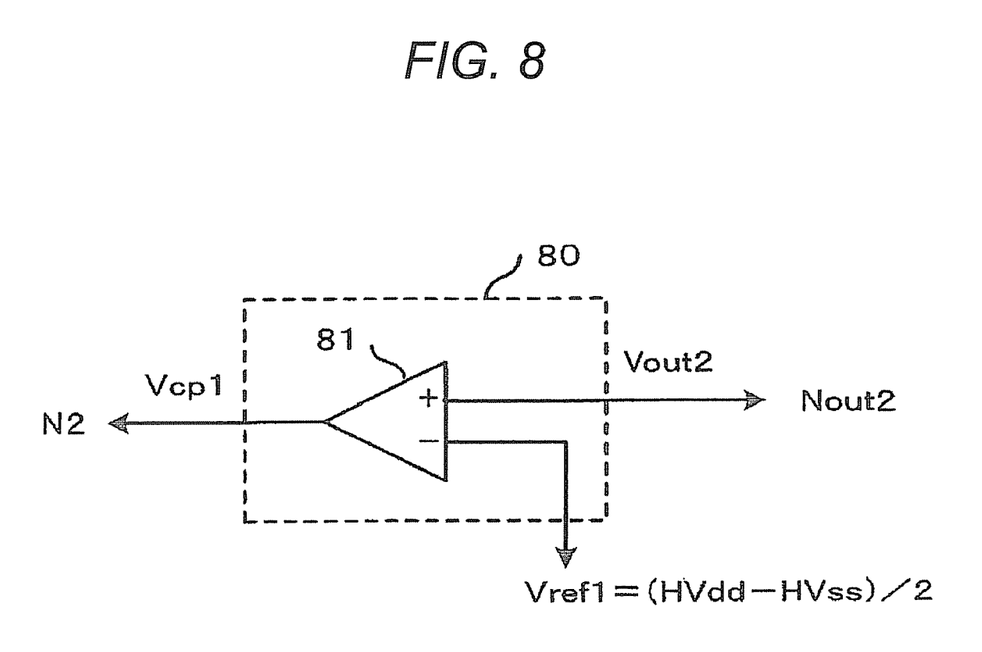
FIG. 8 is a circuit diagram illustrating another control circuit of the semiconductor integrated device according to Embodiment 2.

A comparator can be used instead of the inverters 63. FIG. 8 is a circuit diagram illustrating a control circuit having a comparator.

As illustrated in FIG. 8, the first control circuit 80 includes a comparator 81. A positive input terminal of the comparator 81 is connected to the second output node Nout2. A negative input terminal of the comparator 81 is connected to the first reference value Vref1 supplied from an external device. An output terminal of the comparator 81 is connected to the second node N2.

Although it is sufficient that the first reference value Vref1 is larger than the first amplitude (LVdd−LVss) and is smaller than the second amplitude (HVdd−HVss), generally, the first reference value Vref1 is set to be half the second amplitude, i.e., (HVdd−HVss)/2, similarly to the case of using the inverters.

This is the same with the second control circuit. Detailed description is omitted.

In the embodiments, the first to sixth switching elements are MOS transistors. However, the first to sixth switching elements may be metal insulator semiconductor (MIS) transistors and bipolar transistors.

What is claimed is:

1. A semiconductor integrated device comprising:
   a level-shifting circuit including:
      a first input node to which a first input signal having a first amplitude is input;
      a second input node to which a second input signal having the first amplitude is input;
      a first output node from which a first output signal having a second amplitude being larger than the first amplitude is output; and
      a second output node from which a second output signal having the second amplitude is output;
   a first current mirror circuit including:
      a first input-side transistor; and
      a first output-side transistor connected with the first output node;
   a second current mirror circuit including:
      a second input-side transistor; and
      a second output-side transistor connected with the second output node;
   a first switch circuit including:
      a first switching element that is series-connected with the first input-side transistor and that is controlled based on the first input signal; and
      a second switching element that is series-connected with the first switching element and that is controlled based on the second output signal;
   a second switch circuit including:
      a third switching element that is series-connected with the second input-side transistor and that is controlled based on the second input signal; and
      a fourth switching element that is series-connected with the third switching element and that is controlled based on the first output signal;
   a fifth switching element that is parallel-connected with the first input-side transistor and that is controlled based on the second output signal; and
   a sixths switching element that is parallel-connected with the second input-side transistor and that is controlled based on the first output signal.

2. The semiconductor integrated device according to claim 1,
   wherein the level-shifting circuit respectively level-shift the first and the second input signals each having the first amplitude to the first and the second output signals each having the second amplitude, and
   wherein, in the level-shifting circuit, when the first input signal is "H" and the second input signal is "L", the first output signal is "H" and the second output signal is "L".

3. The semiconductor integrated device according to claim 1,
   wherein the first switch circuit turns on when the first input signal is "H" while the second output signal is "H" and turns off when the second output signal is "L",
   wherein the first current mirror circuit is activated when the first switch circuit turns on and is inactivated when the first switch circuit turns off, and
   wherein, when the first current mirror circuit is activated, the first current mirror circuit charges the first output node to invert the first output signal from "L" to "H".

4. The semiconductor integrated device according to claim 3,
   wherein the fifth switching element is turned on in order to turn off the first input-side transistor of the first current mirror circuit, thereby stopping a charging operation of the first current mirror circuit.

5. The semiconductor integrated device according to claim 1, further comprising:
   a first control circuit that generates a first comparison signal by comparing the second output signal with a first reference value and that controls the second switching element and the fifth switching element by outputting the first comparison signal; and
   a second control circuit that generates a second comparison signal by comparing the first output signal with a second reference value and that controls the fourth switching element and the sixths switching element by outputting the second comparison signal.

6. The semiconductor integrated device according to claim 5,
wherein the first control circuit and the second control circuit include, respectively, even number of inverters connected in series.

7. The semiconductor integrated device according to claim 5,
wherein the first control circuit and the second control circuit include, respectively, a comparator.

8. The semiconductor integrated device according to claim 1,
wherein the first to the sixths switching elements include, respectively, a MOS transistor.

9. The semiconductor integrated device according to claim 1,
wherein, when the first input signal is "H" and the second input signal is "L", the fifth switching element is turned on after the first switching element of the first switch circuit has been turned off.

10. The semiconductor integrated device according to claim 1,
wherein, when the first input signal is "H" and the second input signal is "L", the first switching element of the first switch circuit is turned off after the fifth switching element has been turned on.

11. The semiconductor integrated device according to claim 1,
wherein the level-shifting circuit includes:
a first NMOS transistor having a source connected to a low-side power line, a gate connected to the first input node and a drain connected to the second output node;
a second NMOS transistor having a source connected to the low-side power line, a gate connected to the second input node and a drain connected to the first output node;
a first PMOS transistor having a source connected to a high-side power line, a gate connected to the first output node and a drain connected to the second output node; and
a second PMOS transistor having a source connected to the high-side power line, a gate connected to the second output node and a drain connected to the first output node.

12. The semiconductor integrated device according to claim 1, further comprising:
a first waveform-shaping circuit that is connected to the first output node and that outputs a first shaped signal obtained by waveform-shaping the first output signal; and
a second waveform-shaping circuit that is connected to the second output node and that outputs a second shaped signal obtained by waveform-shaping the second output signal.

13. The semiconductor integrated device according to claim 5, further comprising:
a first waveform-shaping circuit that is connected to the first output node and that outputs a first shaped signal obtained by waveform-shaping the first output signal; and
a second waveform-shaping circuit that is connected to the second output node and that outputs a second shaped signal obtained by waveform-shaping the second output signal.

14. The semiconductor integrated device according to claim 13,
wherein the first waveform-shaping circuit and the second waveform-shaping circuit include, respectively, even number of inverters connected in series, and
wherein the first reference value and the second reference value of the first control circuit and the second control circuit are adjusted to be equal to or larger than a threshold voltage of each inverter of the first waveform-shaping circuit and the second waveform-shaping circuit.

15. A semiconductor integrated device comprising:
a level-shifting circuit including:
a first input node to which a first input signal having a first amplitude is input;
a second input node to which a second input signal having the first amplitude is input;
a first output node from which a first output signal having a second amplitude being larger than the first amplitude is output; and
a second output node from which a second output signal having the second amplitude is output;
a first current mirror circuit including:
a first input-side PMOS transistor; and
a first output-side PMOS transistor connected with the first output node;
a second current mirror circuit including:
a second input-side transistor; and
a second output-side transistor connected with the second output node;
a first switch circuit including:
a first switching element that is series-connected with the first input-side transistor and that is controlled based on the first input signal; and
a second switching element that is series-connected with the first switching element and that is controlled based on the second output signal;
a second switch circuit including:
a third switching element that is series-connected with the second input-side transistor and that is controlled based on the second input signal; and
a fourth switching element that is series-connected with the third switching element and that is controlled based on the first output signal;
a fifth switching element that is parallel-connected with the first input-side transistor and that is controlled based on the second output signal; and
a sixths switching element that is parallel-connected with the second input-side transistor and that is controlled based on the first output signal.

16. The semiconductor integrated device according to claim 15,
wherein the level-shifting circuit respectively level-shift the first and the second input signals each having the first amplitude to the first and the second output signals each having the second amplitude, and
wherein, in the level-shifting circuit, when the first input signal is "H" and the second signal is "L", the first output signal is "H" and the second output signal is "L".

17. The semiconductor integrated device according to claim 15,
wherein the first switch circuit turns on when the first input signal is "H" while the second output signal is "H" and turns off when the second output signal is "L",
wherein the first current mirror circuit is activated when the first switch circuit turns on and is inactivated when the first switch circuit turns off, and
wherein, when the first current mirror circuit is activated, the first current mirror circuit charges the first output node to invert the first output signal from "L" to "H".

18. A semiconductor integrated device comprising:
a level-shifting circuit including:
- a first input node to which a first input signal having a first amplitude is input;
- a second input node to which a second input signal having the first amplitude is input;
- a first output node from which a first output signal having a second amplitude being larger than the first amplitude is output; and
- a second output node from which a second output signal having the second amplitude is output;

a first current mirror circuit including:
- a first input-side transistor; and
- a first output-side transistor connected with the first output node;

a second current mirror circuit including:
- a second input-side PMOS transistor; and
- a second output-side PMOS transistor connected with the second output node;

a first switch circuit including:
- a first switching element that is series-connected with the first input-side transistor and that is controlled based on the first input signal; and
- a second switching element that is series-connected with the first switching element and that is controlled based on the second output signal;

a second switch circuit including:
- a third switching element that is series-connected with the second input-side transistor and that is controlled based on the second input signal; and
- a fourth switching element that is series-connected with the third switching element and that is controlled based on the first output signal;
- a fifth switching element that is parallel-connected with the first input-side transistor and that is controlled based on the second output signal; and
- a sixths switching element that is parallel-connected with the second input-side transistor and that is controlled based on the first output signal.

19. The semiconductor integrated device according to claim 18,
- wherein the level-shifting circuit respectively level-shift the first and the second input signals each having the first amplitude to the first and the second output signals each having the second amplitude, and
- wherein, in the level-shifting circuit, when the first input signal is "H" and the second input signal is "L", the first output signal is "H" and the second output signal is "L".

20. The semiconductor integrated device according to claim 18,
- wherein the first switch circuit turns on when the first input signal is "H" and turns off when the second output signal is "L",
- wherein the first current mirror circuit is activated when the first switch circuit turns on and is inactivated when the first switch circuit turns off, and
- wherein, when the first current mirror circuit is activated, the first current mirror circuit charges the first output node to invert the first output signal from "L" to "H".

* * * * *